US006426677B1

(12) United States Patent
Prentice

(10) Patent No.: US 6,426,677 B1
(45) Date of Patent: Jul. 30, 2002

(54) LINEARIZATION BIAS CIRCUIT FOR BJT AMPLIFIERS

(75) Inventor: John S. Prentice, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/952,184

(22) Filed: Sep. 14, 2001

(51) Int. Cl.[7] ................................................. H03G 3/10
(52) U.S. Cl. ...................... 330/279; 330/281; 330/282; 330/284; 330/285
(58) Field of Search ............................... 330/279, 281, 330/282, 284, 285

(56) References Cited

U.S. PATENT DOCUMENTS 3,942,129 A * 3/1976 Hall ............................. 330/29
6,064,266 A * 5/2000 Anderson et al. ........... 330/284
6,265,942 B1 * 7/2001 Grässle ....................... 330/282

* cited by examiner

Primary Examiner—Michael B Shingleton
(74) Attorney, Agent, or Firm—Gary R. Stanford

(57) ABSTRACT

A linearization bias circuit for an RF BJT amplifier including a reference circuit, a current device and a transconductance amplifier. The linearization bias circuit controls the operating point of the BJT amplifier based on signal level of an input RF signal. The current device provides a constant reference current to the reference circuit, where the constant reference current has a level that is based on a desired collector current of the BJT amplifier. The reference circuit applies a predetermined relationship between DC and AC scale factors of collector current of the BJT amplifier. The transconductance amplifier asserts its output to maintain the constant reference current into the reference terminal of the reference circuit, and in doing so controls the base terminal of the BJT amplifier to modify its operating point to substantially maintain constant transconductance in the presence of varying input voltage amplitudes of the input RF signal.

35 Claims, 2 Drawing Sheets

LINEARIZATION BIAS CIRCUIT FOR BJT AMPLIFIERS

FIELD OF THE INVENTION

The present invention relates to bipolar junction transistor (BJT) amplifiers, and more particularly to linearization bias circuit for BJT amplifiers that extends the compression point by keeping transconductance constant in the presence of varying input voltage amplitudes of an input radio frequency (RF) signal.

DESCRIPTION OF RELATED ART

The 1 decibel (dB) compression point for a radio frequency (RF) bipolar junction transistor (BJT) amplifier has both an input and an output component. The output component results from the output power being limited, depending upon the load, either by voltage swing clipping or by the load current exceeding the DC collector current. The output limited compression point should be reasonably sharp. The input component of compression results from the exponential relationship between base-emitter voltage and collector current. As the peak of the AC component of the base-emitter voltage approaches the thermal voltage $V_T$, the transconductance and input impedance of the BJT amplifier begin to drop off. These effects produce a gradual drop in gain which gives a softer compression point.

The key BJT relationships are now briefly discussed. The collector current $i_c$ of a BJT, when the base-emitter voltage $V_{BE}$ includes an AC term, is provided according to the following equations 1 and 2:

$$i_C \approx I_s \exp\left(\frac{V_{BE}}{V_T}\right) = I_s \exp\left(\frac{V_{DC}}{V_T}\right) \exp\left[\frac{V_P}{V_T}\cos(\omega t)\right] \quad \text{(EQ 1)}$$

$$V_{BE} = V_{DC} + V_P\cos(\omega t)$$

$$i_C \approx i_{DC}[I_0(x) + 2I_1(x)\cos(\omega t) + 2I_2(x)\cos(2\omega t) + 2I_3(x)\cos(3\omega t) + \ldots] \quad \text{(EQ 2)}$$

where $I_s$ is a constant describing the transfer characteristic of the BJT, "exp" denotes the exponential function (natural logarithm), $V_{DC}$ is the average DC applied base-emitter voltage, $V_P$ is the peak voltage of the input RF signal, "Cos" denotes the cosine function, $\omega$ is the fundamental radian frequency of the input signal ($\omega=2\pi f$, where "f" is the fundamental frequency), "t" denotes time, $i_{DC}$ is the DC collector current due to the average DC applied base-emitter voltage $V_{DC}$, "x" is the signal level of an input signal $V_{IN}$ normalized to the thermal voltage $V_T$, and $I_n(x)$ is the modified Bessel function of the first kind of order "n".

The DC collector current $i_{CDC}$ and base current $i_{BDC}$ as well as the peak of the fundamental collector current $i_C(\omega)$ are provided in the following equation 3:

$$i_{C_{DC}} = i_{DC}I_0(x) \quad i_{B_{DC}} = \frac{i_{DC}I_0(x)}{\beta} \quad \text{(EQ 3)}$$

$$i_C(\omega) = i_{DC}2I_1(x) \quad i_{DC} \equiv I_s\exp\left(\frac{V_{DC}}{V_T}\right)$$

where beta ($\beta$) is the ratio of collector current to base current of the BJT. The zero order Bessel function $I_0(x)$ {modified of the first kind} is a scale factor for the DC that accounts for the increase due to rectification of the AC voltage applied to the base terminal of the BJT. Likewise the first order Bessel function $I_1(x)$ is a scale factor for the current at the fundamental frequency. The DC current $i_{DC}$ is defined as the collector current due to the average (DC) applied base-emitter voltage $V_{DC}$.

The notation $i_{DCN}$ denotes the collector current due to the average base-emitter voltage of a particular transistor numbered "N". Although $i_{DC}$ is not a function of the signal level x, the notation $i_{DC}(x)$ denotes the value of $i_{DC}$ forced by the bias circuit when a signal level x is applied to its base-emitter junction. Zero "0" will be substituted for "x" in the special case when no AC voltage is applied to the base-emitter junction.

A linear circuit has constant gain which means the transconductance $g_m$ should be constant and independent of signal level as indicated in the following equation 4:

$$g_m = \frac{i_C(\omega)}{V_P} = \left(\frac{i_{DC}}{V_T}\right)\left[\frac{2I_1(x)}{x}\right] \quad \text{(EQ 4)}$$

Many amplifiers are biased with constant base currents. For example, the base of the amplifier BJT is connected to a reference voltage through a larger value resistor or a current mirror. If the DC base current is constant, so is the DC collector current. For these currents to remain constant with increasing signal level, the DC base-emitter voltage must decrease as indicated by the following equations 5 and 6:

$$i_{DC}(x)I_0(x) = i_{DC}(0)I_0(0) = i_{DC}(0) \rightarrow i_{DC}(x) = \frac{i_{DC}(0)}{I_0(x)} \quad \text{(EQ 5)}$$

$$\Delta V_{DC} = -V_T\ln(I_0(x))$$

$$g_m(x) = \left[\frac{i_{DC}(0)}{V_T}\right]\left[\frac{2I_1(x)}{xI_0(x)}\right] \quad \text{(EQ 6)}$$

where "ln" denotes that natural logarithm function. The transconductance decreases with increasing signal level starting for values of x of about one. A different bias condition is required for constant transconductance as indicated by the following equation 7:

$$g_m = \left[\frac{i_{DC}(x)}{V_T}\right]\left[\frac{2I_1(x)}{x}\right] = \frac{i_{DC}(0)}{V_T} \rightarrow i_{DC}(x) = i_{DC}(0)\left[\frac{x}{2I_1(x)}\right] \quad \text{(EQ 7)}$$

Usually RF BJT amplifier stages have biases which apply either a constant (i.e. DC) base current through an RF isolating resistor or constant base-emitter voltage through an isolating inductor. The base current is often generated by forcing a reference current through a current mirror. A base-emitter voltage bias is often generated by forcing the reference current through a similar BJT, possibly with a different emitter area.

It is desired to provide a bias control circuit for a BJT amplifier that establishes linear operation in the presence of varying input voltage amplitude of an input RF signal.

SUMMARY OF THE PRESENT INVENTION

A linearization bias circuit for a bipolar junction transistor (BJT) amplifier according to an embodiment of the present invention includes a reference circuit, a current device and a transconductance amplifier. The BJT amplifier includes base, collector and emitter terminals in which the base terminal receives an input radio frequency (RF) signal. The reference circuit includes a reference terminal and a control terminal, where the control terminal is coupled to the base terminal of the BJT amplifier to control its operating point based on signal level of the RF signal. The current device provides a constant reference current to the reference terminal of the reference circuit, where the constant reference current has a level that is based on a desired collector current of the BJT amplifier. The transconductance amplifier has an input coupled to the reference terminal and an output coupled to the control terminal of the reference circuit, where the transconductance amplifier asserts its output to maintain the constant reference current into the reference terminal of the reference circuit. The reference circuit applies a predetermined relationship between DC and AC scale factors of collector current of the BJT amplifier. In this manner, the transconductance amplifier controls the base terminal to modify the operating point of the BJT amplifier to substantially maintain constant transconductance in the presence of varying input voltage amplitudes of the input RF signal.

The transconductance amplifier may be implemented as an emitter follower amplifier with an isolation resistor. The output of the transconductance amplifier may have a high impedance at a fundamental frequency of the RF signal, so that it is able to control the DC bias point without affecting the RF signal.

In one embodiment, the predetermined relationship is a linear regression according to an equation $2I_1(x)/x=mI_0(x)+b$, where "x" is the normalized signal level of the RF signal, $I_0(x)$ is a zero order Bessel function representing a DC scale factor and $I_1(x)$ is a first order Bessel function representing an AC scale factor for current at a fundamental frequency of the RF signal. The values "m" and "b" are constants. In a specific embodiment to achieve desired linear operation, m is approximately 0.428 and b is approximately 0.592.

The reference circuit is implemented to substantially define the predetermined relationship to control the operating point in cooperation with the level of the reference current. One configuration of the reference circuit for implementing the relationship $2I_1(x)/x=mI_1(x)+b$ includes a sense BJT and a reference BJT. The sense BJT has a base terminal coupled to the base terminal of the BJT amplifier for receiving the input RF signal, a collector terminal coupled to the reference terminal and an emitter terminal for coupling to an emitter terminal of the BJT amplifier. The sense BJT may have an emitter area that is scaled down by a suitable scale factor relative to the emitter area of the BJT amplifier. The reference BJT has a base terminal, a collector terminal coupled to the reference terminal of the reference circuit and an emitter terminal coupled to the emitter terminal of the sense BJT. A low pass filter capacitor is coupled between the collector and emitter terminals of the sense and reference BJTs to remove AC. A low pass filter circuit is provided including a resistor coupled between the base terminals of the sense and reference BJTs and a capacitor coupled between the base and emitter terminals of the reference BJT. In this manner, the low pass filter circuit removes AC from the base terminal of the reference BJT. In a specific configuration, the constant reference current is approximately 2.34 times a desired collector current of the sense BJT, and the reference BJT has an emitter area that is approximately 1.38 times an emitter area of the sense BJT. It is noted that the constant reference current and the ratio of emitter areas of the sense and reference BJTs may be adjusted to account for circuit imperfections.

In another configuration, the predetermined relationship is according to an equation $2I_1(x)/x=mI_0(nx)$, where n is a predetermined value less than one, such as 0.73. In a specific configuration for implementing this relationship, the reference circuit includes a reference BJT, the low pass filter capacitor and an attenuation circuit. The reference BJT in this configuration may have an emitter area that is scaled down by a suitable scale factor relative to the BJT amplifier.

The reference BJT in this case has a collector terminal coupled to the reference terminal of the reference circuit and an emitter terminal for coupling to an emitter terminal of the BJT amplifier. The low pass filter capacitor is coupled in a similar manner to remove AC from the collector terminal of the reference BJT. The attenuator circuit includes an attenuation resistor coupled between the bases of the reference and amplifier BJTs and an attenuation capacitor coupled between the base and emitter terminals of the reference BJT. The attenuator circuit applies a predetermined percentage of the level of the RF signal to the base terminal of the reference BJT at a fundamental frequency of the RF signal. In a particular embodiment to achieve substantial linearity, the predetermined percentage is approximately 73 percent (0.732). This configuration works for a limited frequency range.

The attenuation circuit may further include a second attenuation capacitor coupled in parallel with the attenuation resistor to expand the potential operable frequency ranges. In a specific configuration for a fundamental frequency f, a resistance R of the attenuation resistor, a capacitance $C_1$ of the first attenuator capacitor, a capacitance $C_2$ of the second attenuator capacitor, and a base to emitter capacitance $C_\pi$ of the reference BJT are such that the magnitude of $(2\pi fRC_2j+1)/(2\pi fR(C_1+C_\pi+C_2)+1)$ is approximately equal to the attenuation factor of 0.732.

A method of biasing a BJT amplifier according to an embodiment of the present invention includes providing the input RF signal to a bias control circuit, providing a constant reference current to the bias control circuit where the constant reference current has a level that is based on a desired DC collector current for the BJT amplifier, and controlling the base terminal of the BJT amplifier in order to substantially maintain constant transconductance of the BJT amplifier. In particular, the bias control circuit modifies the BJT amplifier operating point based on signal level of the input RF signal according to the predetermined relationship.

In one embodiment, the predetermined relationship is $2I_1(x)/x=mI_0(x)+b$ in a similar manner as previously described. In this case, the method may include scaling an emitter area of a reference BJT to be larger than an emitter area of a sense BJT by a predetermined scale factor, applying the input RF signal at the base terminal of the BJT amplifier to a base terminal of the sense BJT, low pass filtering the input RF signal as applied to the base terminal of the sense BJT to remove AC and providing the filtered RF signal to a base terminal of the reference BJT, scaling the constant reference current by a predetermined multiple of a desired DC collector current level of the sense BJT, applying the constant reference current to a reference node coupled to collector terminals of the sense and reference BJTs, low pass filtering AC from reference node, and controlling the DC level at the base terminal of the BJT amplifier using a transconductance amplifier. The transconductance amplifier forces a sum of collector currents of the sense and reference BJTs to be approximately the same as the constant reference current level. In one case, the predetermined scale factor is approximately 1.38 and the predetermined multiple is approximately 2.34.

Alternatively, the predetermined relationship is $2I_1(x)/x=I_0(nx)$ in which n is a constant, such as approximately 0.73. In this case, the method may include attenuating the input RF signal as applied to the base terminal of the sense BJT by a predetermined attenuation factor and providing the attenuated RF signal to a base terminal of a reference BJT, providing the constant reference current at a desired DC collector current level of the BJT amplifier, applying the constant reference current to a reference node coupled to a collector terminal of the reference BJT, low pass filtering AC from the reference node, and controlling DC at the base terminal of the BJT amplifier using a transconductance amplifier. The transconductance amplifier forces a collector current of the reference BJT to be approximately the same as the constant reference current level.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENT(S) OF THE INVENTION

Since control circuits generally process DC, it is desired to find a relationship between the DC current scale factor $I_0(x)$ and the transconductance scale factor $2I_1(x)/x$. One such approximation is linear regression according to the following equation 8:

$$\frac{2I_1(x)}{x} = mI_0(x) + b \quad m = 0.428 \quad b \approx 0.592 \quad 0 \leq x \leq 3 \quad \text{(EQ 8)}$$

which indicates that constant gain may be achieved with a bias control circuit for the amplifier BJT that implements an approximation according to the following equation 9:

$$i_{DC}(x) = \frac{i_{DC}(0)}{\{mI_0(x) + b\}} \rightarrow i_{C_{DC}} = i_{DC}(x)I_0(x) = i_{DC}(0)\frac{[I_0(x)]}{\{mI_0(x) + b\}} \quad \text{(EQ 9)}$$

Figure 1:
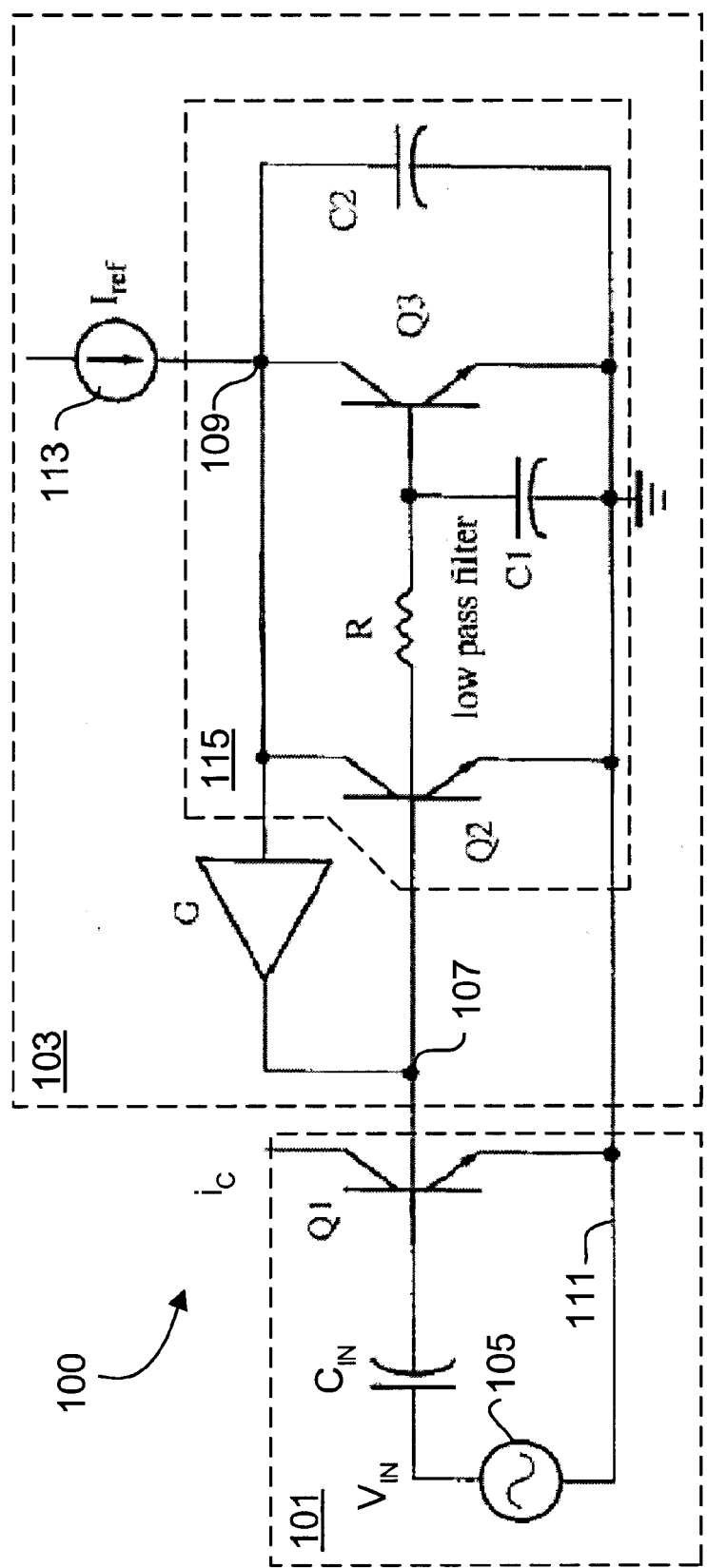
FIG. 1 is a schematic diagram of an RF BJT amplifier circuit according to an embodiment of the present invention that includes a linearization bias circuit that maintains the transconductance of a BJT amplifier substantially constant in the presence of varying input voltage amplitudes of an input radio frequency (RF) signal.

FIG. 1 is a schematic diagram of an RF BJT amplifier circuit 100 according to an embodiment of the present invention. The RF BJT amplifier circuit 100 includes a BJT amplifier circuit 101, with primary BJT amplifier Q1, coupled to a linearization bias circuit 103. As described below, the linearization bias circuit 103 incorporates the relationships described in equations 8 and 9 in order to maintain the transconductance of the BJT Q1 substantially constant in the presence of varying input voltage amplitudes of an input radio frequency (RF) signal $V_{IN}$.

The input signal $V_{IN}$ is provided by an output of a generator 105 to the base terminal of the BJT Q1 through a DC filter capacitor $C_{IN}$. The generator 105 and the emitter terminal of the BJT Q1 are coupled to a common node 111 shown coupled to ground. It is understood that the common node 111 may be coupled instead to any desirable reference signal other than ground. The collector terminal of the BJT Q1 provides an output current signal $i_C$, which is the collector current of the BJT Q1. The generator 105 driving the BJT Q1 may have a relatively low source impedance as compared to the impedance looking into the base terminal of the BJT Q1. Such impedance mismatch makes in the gain of the BJT Q1 relatively independent of the base terminal impedance of the BJT Q1.

The base terminal of the BJT Q1 is coupled to a node 107 of the linearization bias circuit 103, where the node 107 is further coupled to the output of a transconductance amplifier G and to the base terminal of another BJT Q2, referred to as sense transistor Q2. The emitter terminal of the sense transistor Q2 is coupled to the common node 111 (ground) and its collector terminal is coupled to another node 109 of the linearization bias circuit 103. The node 109 is coupled to the input of the transconductance amplifier G. The base terminal of the sense transistor Q2 is coupled to one end of a resistor R, which has its other end coupled to one end of a capacitor C1 and to the base terminal of another BJT Q3, referred to as reference transistor Q3. The other end of the capacitor C1 and the emitter of the reference transistor Q3 are coupled to common node 111. A filter capacitor C2 is coupled between the collector and emitter terminals of the transistors Q2 and Q3. A current source 113 supplies a constant current $I_{ref}$ into node 109. It is noted that the $I_{ref}$ current is constant with respect to RF signal amplitude, but may also be designed to respond to environmental factors, such as temperature or supply voltage as is commonly employed in amplifier design. The transistors Q2 and Q3, the resistor R and the capacitors C1 and C2 form a reference circuit 115 having primary control terminals at nodes 107 and 109.

As described above, BJT Q1 is the amplifier transistor and transistor Q2 is a sense transistor generally smaller than Q1. The DC collector currents of the transistors Q1 and Q2 are scaled by their emitter area ratios, so that the DC collector current of the transistor Q2 may be scaled down relative to the collector current of the BJT Q1 by a desired scale factor, such as one tenth or the like. Transistor Q3 is a reference transistor having the same DC base-emitter voltage as Q1 and Q2. The resistor R and the capacitor C1 form a low pass filter between the bases of Q2 and Q3 so that AC voltage is filtered and not applied to the base of the reference transistor Q3. The voltage drop across the resistor R should be relatively small (e.g., a few millivolts) to be considered negligible, which may be achieved if the betas for the transistors are relatively high such that the base currents are relatively small. Alternatively, the resistor R is replaced by an inductor or a piece of transmission line that has an electrical length approximately equal to 0.25 times the wavelength of the RF carrier. If, however, the voltage drop across the resistor R cannot be made negligibly small for any reason, a relatively small resistors may be added in series with the base terminal of each of the other BJTs for compensation so that the base to emitter DC voltages of all of the BJT's are maintained at a relatively equal level. The transconductance amplifier G closes the bias control loop and supplies the base current and base voltage for the three transistors Q1, Q2 and Q3. One implementation of the transconductance amplifier G is an emitter follower with an isolation resistor between its emitter and the base terminals of the transistors Q1 and Q2.

The transconductance amplifier G forces the sum of the DC collector currents of the transistors Q2 and Q3 to be equal to the reference current $I_{ref}$. The second capacitor C2 represents a second low pass filter that removes AC from the sense transistor Q2. The emitter area of the reference transistor Q3 is configured to be approximately 1.384 times larger than the emitter area of the sense transistor Q2, so that the corresponding transistor currents are scaled by the same ratio. The $I_{ref}$ reference current is approximately 2.337 times larger than the desired collector current of the sense transistor Q2 when there is no AC base-emitter signal applied to the sense transistor Q2. Given these conditions, the relationships provided by the following equations 10 and 11 apply:

$$i_{DC2}(x)I_0(x) + i_{DC3}(x)I_0(0) = I_{ref} \quad \text{(EQ 10)}$$

$$i_{DC2}(x)I_0(x) + 1.384 i_{DC2}(0) \to i_{DC2}(x) = \frac{2.337 i_{DC2}(0)}{I_0(x) + 1.384} = \frac{i_{DC2}(0)}{0.428 I_0(x) + 0.592} \quad \text{(EQ 11)}$$

Equation 11 describes the desired relationship to linearize the gain of the BJT Q1. The control loop of the linearization bias circuit 103 through the transconductance amplifier G should respond faster than the modulating signal that modulates the amplitude of the RF carrier signal. This technique for gain linearization also provides phase linearization since by keeping the transconductance of the BJT Q1 constant. The diffusion capacitance component of the base to emitter capacitance of the BJT Q1 is also held constant, where the base to emitter capacitance of the BJT Q1 is referred to as $C_\pi$.

The linearization bias circuit 103, as presented, does not necessarily correct for the input power loss due to the $2_{nd}$ and $3_{rd}$ harmonic base currents. In practice, the value of the $I_{ref}$ reference current and the emitter area ratio between the transistors Q2 and Q3 may be adjusted slightly to account for these and other imperfections, such as IR drop in the low pass filter (R and C1) or finite gain of the transconductance amplifier G.

The transconductance scale factor at a signal level of x is approximately equal to the DC scale factor at a signal level of approximately 73.2%, which provides another useful approximation as described by the following equation 12:

$$\frac{2 I_1(x)}{x} \approx I_0(nx) \quad n = 0.732 \quad 0 \leq x \leq 3 \quad \text{(EQ 12)}$$

In this manner, substantially constant gain may also be achieved with a bias control circuit for the BJT Q1 that implements an approximation according to the following equation 13:

$$i_{DC}(x) = \frac{i_{DC}(0)}{I_0(nx)} \to i_{C_{DC}} = i_{DC}(x)I_0(x) = i_{DC}(0)\frac{[I_0(x)]}{[I_0(nx)]} \quad \text{(EQ 13)}$$

Figure 2:
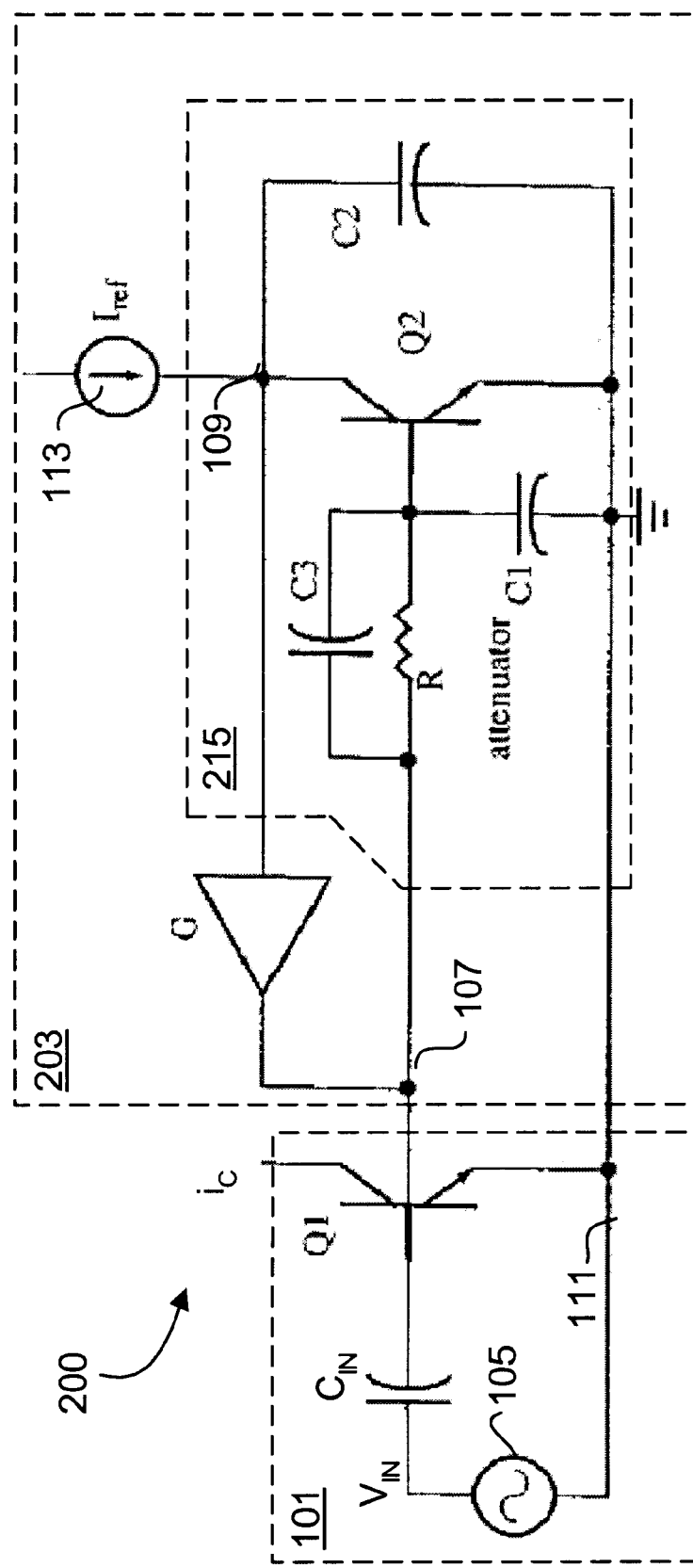
FIG. 2 is a schematic diagram of an RF BJT amplifier circuit according to an alternative embodiment of the present invention that includes a linearization bias circuit that maintains the transconductance of a BJT amplifier substantially constant in the presence of varying input voltage amplitudes of the input RF signal.

FIG. 2 is a schematic diagram of another RF BJT amplifier circuit 200 according to another embodiment of the present invention. The RF BJT amplifier circuit 200 includes the same BJT amplifier circuit 101 with primary BJT amplifier Q1 coupled to a different linearization bias circuit 203. The linearization bias circuit 203 incorporates the relationships described in equations 12 and 13 in order to maintain the transconductance of the BJT Q1 substantially constant in the presence of varying input voltage amplitudes of the input radio frequency (RF) signal $V_{IN}$.

The linearization bias circuit 203 appears similar to the linearization bias circuit 103 and includes the current source 113 and the transconductance amplifier G coupled in similar manner at nodes 107 and 109 to a reference circuit 215. For the reference circuit 215, however, the base terminal of the amplifier BJT Q1 is coupled directly via node 107 to one end of a resistor R and a capacitor C3. The other ends of the resistor R and capacitor C3 are coupled together at the base terminal of a BJT Q2. Another capacitor C1 is coupled between the base terminal of the transistor Q2 and the common node 111. The filter capacitor C2 is coupled between the collector and emitter terminals of the reference transistor Q2.

The reference transistor Q2 has the same DC base-emitter voltage as the BJT Q1 except that its AC voltage is 73.2% of that applied to Q1 due to the high frequency attenuator between the base terminals of the transistors Q1 and Q2 formed by the resistor R and the capacitors C1 and C3. The transconductance amplifier G closes the bias control loop of the linearization bias circuit 203 and supplies the base current and base voltage to the transistors Q1 and Q2 in a similar manner as described for the RF BJT amplifier circuit 100. The transconductance amplifier G forces the DC collector current of the reference transistor Q2 to be equal to the reference current $I_{ref}$. The capacitor C2 again is a second low pass filter that removes the AC from the transistor Q2. The emitter area of Q1 is larger than Q2, so that the collector current of Q2 is scaled by the same ratio (in a similar manner as described above for the transistors Q1 and Q2 for the RF BJT amplifier circuit 100). Also, the $I_{ref}$ reference current in this case is equal to the desired collector current of the reference transistor Q2 when there is no AC base-emitter signal for the reference transistor Q2.

If the magnitude of the input signal $V_{IN}$ applied to the base terminal of the BJT Q1 is "x" and the fraction of that magnitude applied to the reference transistor Q2 is "n", then the relationships provided in the following equations 14 and 15 apply:

$$i_{DC2}(nx)I_0(nx) = I_{ref} \quad \frac{C_3}{(C_1 + C_\pi) + C_3} = 0.732 \quad \omega RC_3 \gg 1 \quad \text{(EQ 14)}$$

$$i_{DC2}(x)I_0(nx) = i_{DC2}(0) \to i_{DC2}(x) = \frac{i_{DC2}(0)}{I_0(nx)} \quad i_{DC2}(nx) = i_{DC2}(x) \quad \text{(EQ 15)}$$

Equations 14 and 15 describe operation of the RF BJT amplifier circuit 200, which is the desired relationship to linearize the gain of the BJT Q1. The capacitive divider C1 and C3 should be configured so that the bias control loop of the linearization bias circuit 203 through the transconductance amplifier G is faster than the bias control loop of the linearization bias circuit 103 described previously. The attenuator function is of the attenuator is described according the following equation 16:

$$\left| \frac{j\omega RC_3 + 1}{j\omega R(C_1 + C_\pi + C_3) + 1} \right| = 0.732 \quad \text{(EQ 16)}$$

where $C_\pi$ is the base to emitter capacitance of the reference transistor Q2. In an alternative embodiment, the capacitor C3 is eliminated and the values of the capacitor C1 and the resistor R are chosen to achieve acceptable operation over a more limited frequency band.

The bias circuits described herein maintain constant gain in the presence of varying signal amplitudes. The same circuit design principles may be applied so that the gain increases or decreases in the presence of varying signal amplitudes. For example, for a multiple gain stage amplifier, one gain stage may be implemented in accordance with the principles described herein to compensate for a signal varying gain in another stage so that overall gain remains constant.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A linearization bias circuit for a bipolar junction transistor (BJT) amplifier including a base terminal that receives an input radio frequency (RF) signal, the linearization bias circuit comprising:

a reference circuit having a control terminal for coupling to the base terminal of the BJT amplifier and a reference terminal;

a current device, coupled to the reference terminal of the reference circuit, that provides a constant reference current, wherein the constant reference current has a level that is based on a desired DC collector current of the BJT amplifier; and a transconductance amplifier, having an input coupled to the reference terminal of the reference circuit and an output coupled to the control terminal of the reference circuit, that asserts its output to maintain the constant reference current into the reference terminal of the reference circuit;

wherein the reference circuit applies a predetermined relationship between DC and AC scale factors of collector current of the BJT amplifier so that the transconductance amplifier applies its output for controlling the base terminal of the BJT amplifier to modify the operating point of the BJT amplifier to substantially maintain constant transconductance.

2. The linearization bias circuit of claim 1, wherein the transconductance amplifier comprises an emitter follower amplifier with an isolation resistor.

3. The linearization bias circuit of claim 1, wherein the output of the transconductance amplifier has a high impedance at a fundamental frequency of the RF signal.

4. The linearization bias circuit of claim 1, wherein the predetermined relationship is a linear regression according to an equation $2I_1(x)/x = mI_0(x) + b$, wherein x is a normalized signal level of the RF signal, wherein $I_0(x)$ is a zero order Bessel function representing a DC scale factor, wherein $I_1(x)$ is a first order Bessel function representing an AC scale factor for current at a fundamental frequency of the RF signal, and wherein m and b are constants.

5. The linearization bias circuit of claim 4, wherein m is approximately 0.428 and b is approximately 0.592.

6. The linearization bias circuit of claim 4, wherein the reference circuit comprises:

a sense BJT having a base terminal coupled to the control terminal of the reference circuit for receiving the input RF signal, a collector terminal coupled to the reference terminal of the reference circuit and an emitter terminal for coupling to an emitter terminal of the BJT amplifier;

a reference BJT having a base terminal, a collector terminal coupled to the reference terminal of the reference circuit and an emitter terminal coupled to the emitter terminal of the sense BJT;

a low pass filter capacitor coupled between the collector and emitter terminals of the sense and reference BJTs to remove AC; and a low pass filter circuit including a resistor coupled between the base terminals of the sense and reference BJTs and a capacitor coupled between the base and emitter terminals of the reference BJT, the low pass filter circuit removing AC from the base terminal of the reference BJT.

7. The linearization bias circuit of claim 6, wherein the constant reference current is approximately 2.34 times a desired collector current of the BJT amplifier, and wherein the reference BJT has an emitter area that is approximately 1.38 times an emitter area of the sense BJT.

8. The linearization bias circuit of claim 7, wherein the sense BJT has an emitter area that is smaller than an emitter area of the BJT amplifier by a predetermined scale factor.

9. The linearization bias circuit of claim 7, wherein the constant reference current and a ratio of emitter areas of the sense and reference BJTs are adjusted to account for circuit imperfections.

10. The linearization bias circuit of claim 1, wherein the predetermined relationship is according to an equation $2I_1(x)/x = mI_0(nx)$, wherein x is a normalized signal level of the input RF signal, wherein $I_0(x)$ is a zero order Bessel function representing a DC scale factor, wherein $I_1(x)$ is a first order Bessel function representing an AC scale factor for current at a fundamental frequency of the RF signal, and wherein n is a predetermined value less than one.

11. The linearization bias circuit of claim 10, wherein n is approximately 0.73.

12. The linearization bias circuit of claim 10, wherein the reference circuit comprises:

a reference BJT having a base terminal, a collector terminal coupled to the reference terminal of the reference circuit and an emitter terminal for coupling to an emitter terminal of the BJT amplifier;

a low pass filter capacitor coupled between the collector and emitter terminals of the reference BJT to remove AC; and an attenuator circuit including an attenuation resistor coupled between the control terminal of the reference circuit and the base terminal of the reference BJT, and a first attenuation capacitor coupled between the base and emitter terminals of the reference BJT, the attenuator circuit applying a predetermined percentage of the level of the RF signal to the base terminal of the reference BJT at a fundamental frequency.

13. The linearization bias circuit of claim 12, wherein the predetermined percentage is approximately 73 percent.

14. The linearization bias circuit of claim 12, wherein the reference BJT has an emitter area that is smaller than an emitter area of the BJT amplifier by a predetermined scale factor.

15. The linearization bias circuit of claim 12, wherein the attenuation circuit includes a second attenuation capacitor coupled in parallel with the attenuation resistor.

16. The linearization bias circuit of claim 15, wherein for a fundamental frequency f, a resistance R of the attenuation resistor, a capacitance $C_1$ of the first attenuator capacitor, a capacitance $C_2$ of the second attenuator capacitor, and a base to emitter capacitance $C_\pi$ of the reference BJT are such that the magnitude of $(2\pi f R C_2 j + 1)/(2\pi f R (C_1 + C_\pi + C_2) + 1)$ is approximately equal to 0.73.

17. A method of biasing a bipolar junction transistor (BJT) amplifier, the BJT amplifier having a base terminal that receives an input radio frequency (RF) signal, the method comprising:

providing the input RF signal to a bias control circuit;

providing a constant reference current to the bias control circuit, the constant reference current having a level that is based on a desired DC collector current for the BJT amplifier; and the bias control circuit controlling the base terminal of the BJT amplifier to modify the BJT amplifier operating point based on signal level of the input RF signal according to a predetermined relationship between a DC current scale factor and a transconductance scale factor of the BJT amplifier at a fundamental frequency of the input RF signal in order to substantially maintain constant transconductance of the BJT amplifier.

18. The method of claim 17, wherein the DC current scale factor is a zero order Bessel function $I_0(x)$ in which x is a normalized signal level of the RF signal, wherein the transconductance scale factor is $2I_1(x)/x$ in which $I_1(x)$ is a first order Bessel function, and wherein the predetermined relationship is $2I_1(x)/x = mI_0(x) + b$ in which m and b are constants.

19. The method of claim 18, wherein m is approximately 0.43 and wherein b is approximately 0.59.

20. The method of claim 18, further comprising:
scaling an emitter area of a reference BJT to be larger than an emitter area of a sense BJT by a predetermined scale factor;
applying the input RF signal at the base terminal of the BJT amplifier to a base terminal of the sense BJT;
generating a filtered RF signal by low pass filtering the input RF signal as applied to the base terminal of the sense BJT to remove AC and providing the filtered RF signal to a base terminal of the reference BJT;
scaling the constant reference current by a predetermined multiple of a desired DC collector current level of the BJT amplifier;
applying the constant reference current to a reference node coupled to collector terminals of the sense and reference BJTs;
low pass filtering AC from reference node; and
controlling the DC level at the base terminal of the BJT amplifier using a transconductance amplifier that forces a sum of collector currents of the sense and reference BJTs to be approximately the same as the constant reference current level.

21. The method of claim 20, wherein the predetermined scale factor is approximately 1.38 and wherein the predetermined multiple is approximately 2.34.

22. The method of claim 17, wherein the DC current scale factor is a zero order Bessel function $I_0(x)$ in which x is a normalized signal level of the RF signal, wherein the transconductance scale factor is $2I_1(x)/x$ in which $I_1(x)$ is a first order Bessel function, and wherein the predetermined relationship is $2I_1(x)/x=I_0(nx)$ in which n is a constant.

23. The method of claim 22, wherein n is approximately 0.73.

24. The method of claim 22, further comprising:
generating an attenuated RF signal by attenuating the input RF signal as applied to the base terminal of the sense BJT by a predetermined attenuation factor and providing the attenuated RF signal to a base terminal of a reference BJT;
providing the constant reference current at a desired DC collector current level of the BJT amplifier;
applying the constant reference current to a reference node coupled to a collector terminal of the reference BJT;
low pass filtering AC from the reference node; and
controlling DC at the base terminal of the BJT amplifier using a transconductance amplifier that forces a collector current of the reference BJT to be approximately the same as the constant reference current level.

25. The method of claim 24, wherein the predetermined attenuation factor is 0.73.

26. A method of linearizing gain of a radio frequency (RF) bipolar junction transistor (BJT) amplifier, comprising:
applying a DC base to emitter voltage of the BJT amplifier to a base to emitter junction of a reference BJT;
applying a portion of an input AC signal to the base to emitter junction of the reference BJT;
filtering AC from a collector terminal of the reference BJT;
applying a constant current to the collector terminal of the reference BJT, the constant current having a level based on desired DC current level of the BJT amplifier; and
applying feedback control between the collector terminal of the reference BJT and the base terminals of the reference BJT and the BJT amplifier to maintain a collector current of the reference BJT at the fixed reference level so that the DC base to emitter voltage of the BJT amplifier varies with the level of the input AC signal to maintain relatively constant transconductance of the BJT amplifier.

27. The method of claim 26, wherein said applying a portion of an input AC signal comprises providing an attenuator between the base terminals of the reference BJT and the BJT amplifier.

28. The method of claim 26, wherein said applying a portion of an input AC signal comprises attenuating the input AC signal applied to the base terminal of the reference BJT by approximately 73%.

29. The method of claim 26, further comprising scaling an emitter area of the reference BJT relative to an emitter area of the BJT amplifier by a predetermined scale factor.

30. The method of claim 29, wherein said applying feedback control comprises presenting feedback control that is high impedance at a frequency level of the input AC signal.

31. The method of claim 26, further comprising:
said applying a portion of an input AC signal to the base to emitter junction of the reference BJT comprising applying all of the input AC signal to the base to emitter junction of the reference BJT, the reference BJT comprising a first reference BJT;
applying the DC base to emitter voltage of the BJT amplifier to a base to emitter junction of a second reference BJT;
filtering AC from the collector terminals of the first and second reference BJTs;
scaling an emitter area of the second reference BJT relative to an emitter area of the first reference BJT; and
said applying feedback control comprising applying feedback control between the collector terminals of the first and second reference BJTs and the base terminals of the first reference BJT and the BJT amplifier to maintain a sum of collector currents of the first and second reference BJTs at the fixed reference level so that the DC base to emitter voltage of the BJT amplifier varies with the level of the input AC signal to maintain relatively constant transconductance of the BJT amplifier.

32. The method of claim 31, wherein said applying the DC base to emitter voltage of the BJT amplifier to a base to emitter junction of a second reference BJT comprises low pass filtering the base to emitter voltage of the first reference BJT and applying a filtered signal to the base terminal of the second reference BJT.

33. The method of claim 31, wherein said scaling an emitter area of the second reference BJT relative to an emitter area of the first reference BJT comprises scaling the emitter area of the second reference BJT to be approximately 1.38 times larger than the emitter area of the first reference BJT.

34. The method of claim 33, wherein said applying a constant current comprises applying a constant current having a level that is approximately 2.34 times a desired DC current level of the first reference BJT.

35. The method of claim 34, wherein an emitter area of the first reference BJT is scaled by a predetermined scale factor relative to an emitter area of the BJT amplifier.

* * * * *